(12) United States Patent
Enroth et al.

(10) Patent No.: US 6,248,961 B1
(45) Date of Patent: Jun. 19, 2001

(54) WAVE SOLDER APPLICATION FOR BALL GRID ARRAY MODULES AND SOLDER PLUG

(75) Inventors: Wesley M. Enroth, Mooresville; George D. Oxx, Jr., Concord; Jenny B. Porter, Charlotte, all of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/211,976

(22) Filed: Dec. 15, 1998

(51) Int. Cl.[7] ................................... H01R 9/09
(52) U.S. Cl. .......................... 174/265; 174/263
(58) Field of Search ................. 174/262, 263, 174/264, 265, 260; 361/767, 768, 773, 782, 783, 791

(56) References Cited

U.S. PATENT DOCUMENTS

| | | |
|---|---|---|
| 4,739,919 | 4/1988 | Van Den Brekel et al. . |
| 5,326,937 * | 7/1994 | Watanabe ............................ 174/263 |
| 5,402,314 * | 3/1995 | Amago et al. ...................... 361/760 |
| 5,434,365 * | 7/1995 | Mori et al. .......................... 174/262 |
| 5,511,306 | 4/1996 | Denton et al. . |

* cited by examiner

*Primary Examiner*—Jeffrey Gaffin
*Assistant Examiner*—Kamand Cuneo
(74) *Attorney, Agent, or Firm*—Schmeiser, Olsen & Watts; Lawrence R. Fraley

(57) ABSTRACT

A method and product for fabricating a printed circuit board assembly comprising a via, wherein the method inhibits the flow of molten solder into the via during a wave soldering step, thereby preventing heat transfer that might otherwise degrade a solder joint at a top pad that is thermally coupled to the via. The method includes the steps of: (1) fastening a bottom component to the bottom surface of the circuit board by a screening and reflow of solder paste that also generates a solder plug in the via; (2) fastening top components to the top surface of the circuit board by a screening and reflow of solder paste, wherein the top components have ball grid arrays and other surface mount devices that are to be affixed to pads which are connected to vias; and (3) wave soldering the bottom surface to affix additional components onto the circuit board, such as pin-in-hole components placed on the top surface. The solder plug formed in the via during the first step prevents molten solder from flowing into the via during the subsequent wave soldering step, thereby inhibiting heat transfer from the molten solder to the solder joint at the top pad.

15 Claims, 9 Drawing Sheets

WAVE SOLDER APPLICATION FOR BALL GRID ARRAY MODULES AND SOLDER PLUG

BACKGROUND OF THE INVENTION

1. Technical Field

The present invention relates to a printed circuit board and more particularly to a technique and product for fabricating a printed circuit board so as to prevent the flow of molten solder into a via during the process of wave soldering the bottom surface of the circuit board.

2. Related Art

A printed circuit board typically accommodates a surface mount device such as a ball grid array (BGA) module. A BGA module comprises an array of solder balls located on the underside of the BGA module. The top surface of a printed circuit board contains a landing area comprising a corresponding array of top pads. When a BGA module is installed on the landing area of the top surface, each solder ball rests on a top pad and is affixed to the top pad by means of a solder joint. Each such top pad is electrically connected to a via. The via is a cylindrical hole extending through the thickness of the circuit board and is lined with a material, such as copper, that acts as both an electrical and a thermal conductor. The via provides a path of electrical conduction between the BGA module and electrical circuit patterns located within internal layers of the circuit board.

After BGA modules are installed on the top surface of a circuit board, pin-in-hole components such as connectors, single in-line packages (SIPs), and dual in-line packages (DIPs) are placed on the top surface of the circuit board and are affixed by wave soldering the bottom surface of the circuit board. During the wave soldering of the bottom surface, the circuit board is transported over a molten bath of solder, wherein upward movement of solder through a chimney causes a fountain of solder to be drawn into pin holes so as to encase leads of pin-in-hole components. Unfortunately, the molten solder also travels up the vias. The hot solder within a via transfers substantial heat to its associated top pad because of a large thermal conductance between the via and the pad. Accordingly, the solder joint at the top pad is susceptible to reflow (liquidization and redistribution) from the applied heat, which may cause an open circuit. Alternatively, the heat and consequent reflow may degrade the integrity of the solder joint, thereby making the solder joint susceptible to fracture from stress during subsequent usage of the circuit board.

In order to avoid the expense and time delay associated with rework and repair due to impaired solder joints resulting from wave soldering, it is necessary to block the transfer of heat from the molten solder to the top pads. The prevailing method of inhibiting such heat transfer is to cover the via opening at the bottom surface of the circuit board with insulating material such as KAPTON® (a trademark of DuPont for a polyimide) tape. See U.S. Pat. No. 5,511,306 (Denton et al., Apr. 4, 1994) which is hereby incorporated by reference. The technique of covering the via opening has the disadvantages of adding steps to the board-fabrication process and incurring the cost of materials such as the KAPTON tape.

Thus, there is a need for an efficient and inexpensive method of preventing hot molten solder from flowing up through a via during the wave soldering process in order to inhibit heat transfer from the molten solder to a top pad.

SUMMARY OF THE INVENTION

The present invention provides a method and product of inhibiting the transfer of heat, during a wave soldering of the bottom surface of a printed circuit board, from the molten solder to a solder joint at a top pad on the top surface. The present invention creates a mechanical plug in the via prior to the wave soldering in order to obstruct the bottomside flow of molten solder into the interior of the via. By preventing the molten solder from transferring heat to the conductive lining of the via, the plug shields the top pad from heat that might otherwise cause degradation of the solder joint at the top pad.

Affixation of Surface Mount Technology (SMT) components onto the bottom surface of the printed circuit board is accomplished by screening solder paste onto bottomside pads, dispensing adhesive onto the bottom surface in the vicinity of the solder paste, placing each component on the bottom surface by placing the component body on the adhesive and the component lead on the solder paste, and reflowing the solder paste and adhesive. This provides a mechanical and electrical connection between the bottomside components and the bottom surface. The present invention enables the plug to be formed as a part of this screening and reflow step. This is accomplished by having the screen comprise apertures corresponding to both the bottom pads and the vias. In this manner, solder paste is screened into the vias at the same time that solder paste is screened onto the bottom pads. The reflow step creates plugs of solder in the vias by redistributing the solder paste within the vias at the same time that the solder paste on the bottom pads are reflowed to form solder joints.

After completion of the bottomside process, BGA modules and other components may be affixed to the top surface of the circuit board by use of another screening and reflow process which creates solder joints at the pad-component interfaces on the top surface of the circuit board. Next, pin-in-hole components on the top surface, as well as additional components previously mounted on the bottom surface, may be affixed to the circuit board by wave soldering. During the wave soldering of the bottom surface, the solder joints on top pads attached to vias are adequately protected from thermal degradation by the insulating effect of the plugged vias.

A solder plug in a via is effective for the present invention because the plug prevents molten solder from entering the via and the plug has a high thermal resistance to the conductive transport of heat. Nevertheless, because the solder plug is a good electrical conductor, the plug may serve as an electrical contact point for placing probes and the like during a testing phase after the circuit board assembly is completed. The plug provides the additional advantage of preventing oxidation within the via lining. This is especially valuable, because the material that lines the via, typically copper, is subject to oxidation and an oxidized via lining is ineffective for conducting electricity to an applied instrumental probe. Although the via lining is typically coated with a material that inhibits oxidation, this protective coating can be burned off during the heating phases (e.g., during reflow) of circuit board assembly. The consequent oxidation of the via lining after loss of the protective coating places an upper limit on circuit board assembly time. The solder plug of the present invention circumvents these problems by inhibiting oxidation of the via lining and providing an accessible electrical contact surface for an applied probe.

Thus, the present invention has several advantages. The present invention provides a low cost, time-efficient method of preventing thermal degradation of solder joints at top pads that are connected to vias. The present invention also eliminates the extra step inherent in the prior art method of taping the via opening. Additionally, the present invention inhibits oxidation of the via lining, thereby providing electrical contact surfaces for probing the printed circuit board at the vias during testing of the circuit board following assembly.

BRIEF DESCRIPTION OF THE DRAWINGS

FIG. 1 illustrates a top perspective view of a simplified circuit board 10 having a top surface 12, a bottom surface 14, and one or more middle layers 16. Assembly of BGA component 18 and other components to the top surface 12, and assembly of bottom components to the bottom surface 14, of the printed circuit board 10 may be accomplished in the following steps: (1) installing bottom components to the bottom surface 14, typically by the screening and reflow of solder paste; (2) installing the BGA component 18 and other components to the top surface 12, typically by the screening and reflow of solder paste; and (3) wave soldering the bottom surface 14 to affix pin-in-hole components on surface 12 (e.g., connectors, SIPS, DIPS) as well as additional components previously mounted on the bottom surface 14. During the wave soldering, components affixed to the bottom surface may be shielded from the wave soldering by use of a mask such as that described in U.S. Pat. No. 4,739,919 (Van Den Becked et al., Jun. 15, 1987) which is hereby incorporated by reference. Note that the first two steps, installing of components to the bottom surface 14 and top surface 12, are interchangeable for the purpose of the present invention.

FIG. 2 shows the top surface 12 with a BGA landing area 30 for receiving the BGA component 18 (component 18 is shown in FIG. 1). The landing area 30 comprises an ordered array of "dogbones" 31. Each dogbone 31 comprises a conductive top pad 32, a via 33, and a conductive connecting strip 38 that connects the top pad 32 to the via 33. The via 33 comprises a cylindrical void 34 within a conductive lining 36 through the circuit board 10 from the top surface 12 to the bottom surface 14. Each via 33 is electrically coupled to other vias and to other electrical components by electrical circuit traces 54 in the middle layer 16, as illustrated in a middle-layer cross sectional view in FIG. 3. It should be noted that a landing area for a BGA component need not be based on a dogbone pattern. Any conductive pattern that connects a top pad to a via will suffice. FIG. 4, for example, illustrates a top surface 12 with a BGA landing area 40 in which a conductive connecting plate 48 electrically couples a top pad 42 to a via 43, wherein the via 43 comprises a void 44 within a conductive lining 46.

FIG. 5, which depicts a top perspective view of a via 33 connected to a top pad 32, illustrates the electrical connections of the present invention. The BGA component 18 (component 18 is shown in FIG. 1) contains an ordered array of solder balls 56 and each solder ball 56 is to be affixed to a corresponding top pad 32. The path of electrical conduction is from the solder ball 56 to the circuit trace 54: solder ball 56 to top pad 32 to connecting strip 38 to via lining 36 to circuit trace 54 (circuit trace 54 is shown in FIG. 3).

FIG. 5 also illustrates how, absent the present invention, heat would be transferred from molten solder 60 to the top pad 32 during the wavesoldering of the bottom surface 14. The molten solder 60 from the wave soldering source 58 is drawn into the via void 34, where it contacts the via lining 36 and passes heat to the via lining. Heat is then conducted along the via lining 36 into the connecting strip 38 (or into the connecting plate 48 for the configuration of FIG. 4) and finally into the solder pad 32 where it may reflow the solder joint and cause an open circuit or degrade the integrity of the solder joint.

FIGS. 6 and 7 illustrate how the present invention prevents heat from the molten solder from being transferred to the top pad 32. Referring to FIG. 6, which depicts a cross-sectional view of the printed circuit board 10 with a screen 62 mounted to the bottom surface 14, heat is prevented from being transferred from the molten solder 60 to the top pad 32 by modifying the step of screening and reflowing of solder paste during installation of bottom components to the bottom surface 14. During the screening of the bottom surface 14, solder paste 64 is applied through the screen 62 to a bottom pad 66 to form a solder layer 68 (for subsequent mounting of a bottom component) and into the via void 34 to form a solder mass 69. After the screen 62 is removed and the bottom component is attached to the solder layer 68, the solder layer 68 and the solder mass 69 are reflowed causing affixation of the bottom component to the bottom surface 14 and redistribution of the solder mass 69 to form a plug.

Figure 7:
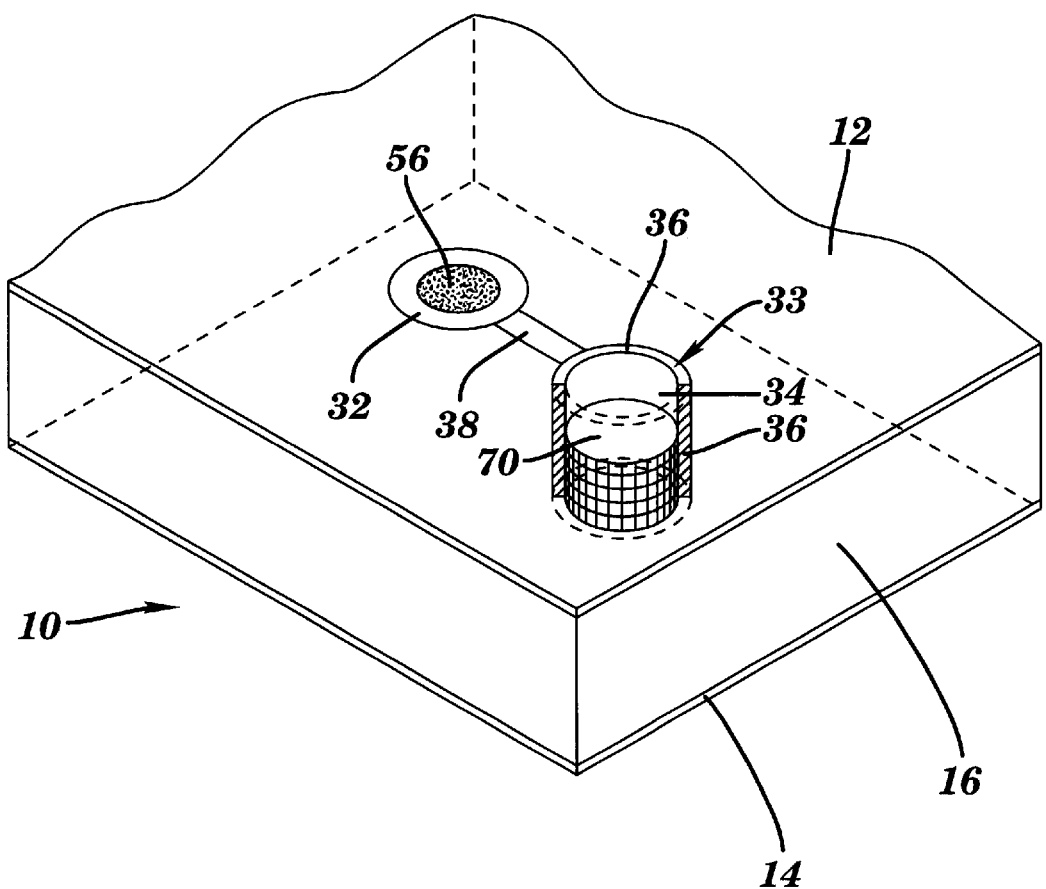
FIG. 7 depicts a top perspective view of the via in FIG. 2, illustrating a solder plug in the via, wherein the via is shown in its entirety in a partially cut-away configuration in accordance with the preferred embodiment of the present invention.

The plug 70, which is shown in FIG. 7, is capable of inhibiting the flow of molten solder into the via void 34 in the subsequent wave soldering step, which effectively inhibits heat transfer from molten solder to the top pad 32. Generation of the plug 70 in the preceding screening and reflow step is essentially free of cost inasmuch as the screening and reflow is performed during the step of affixing the bottom component to the bottom surface 14. For embodiments not requiring screening and reflow to affix a bottom component, a screening and reflow step could nevertheless be added to prevent heat transfer from molten solder to a top pad 32.

Figure 1:
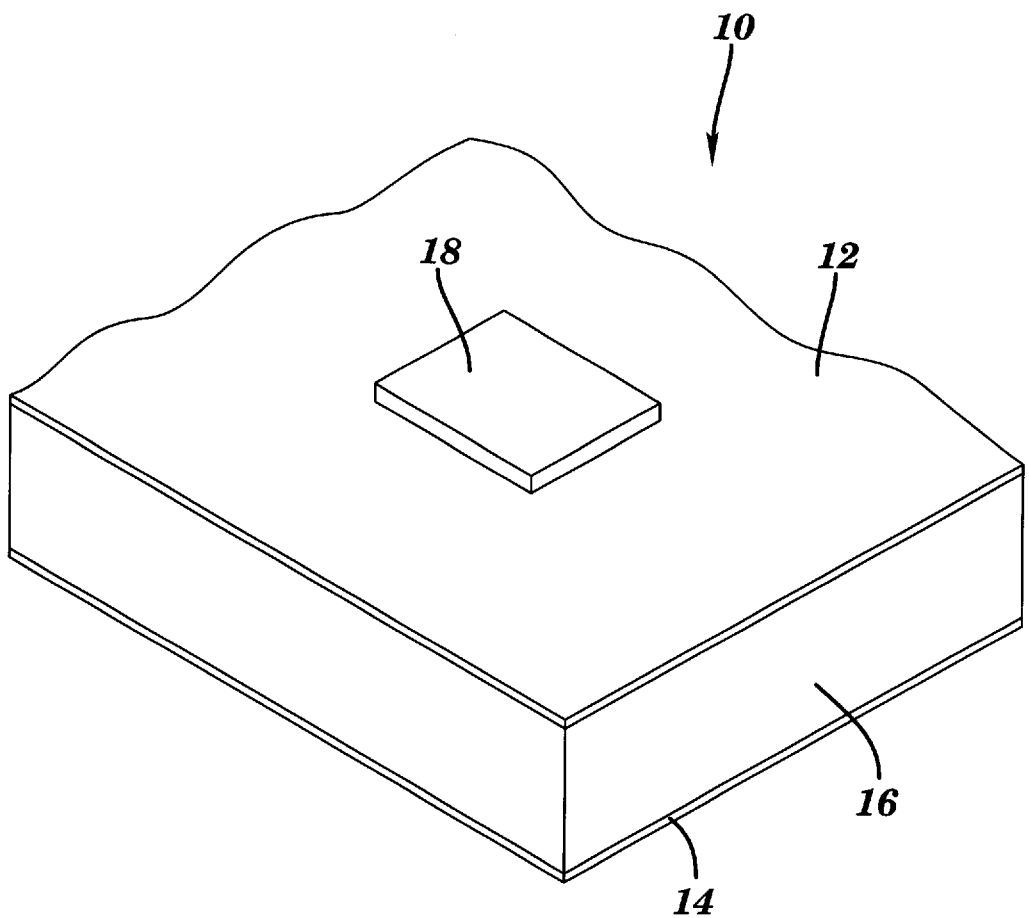
FIG. 1 depicts a top perspective view of a simplified circuit board assembly in accordance with the preferred embodiment of the present invention.
Figure 2:
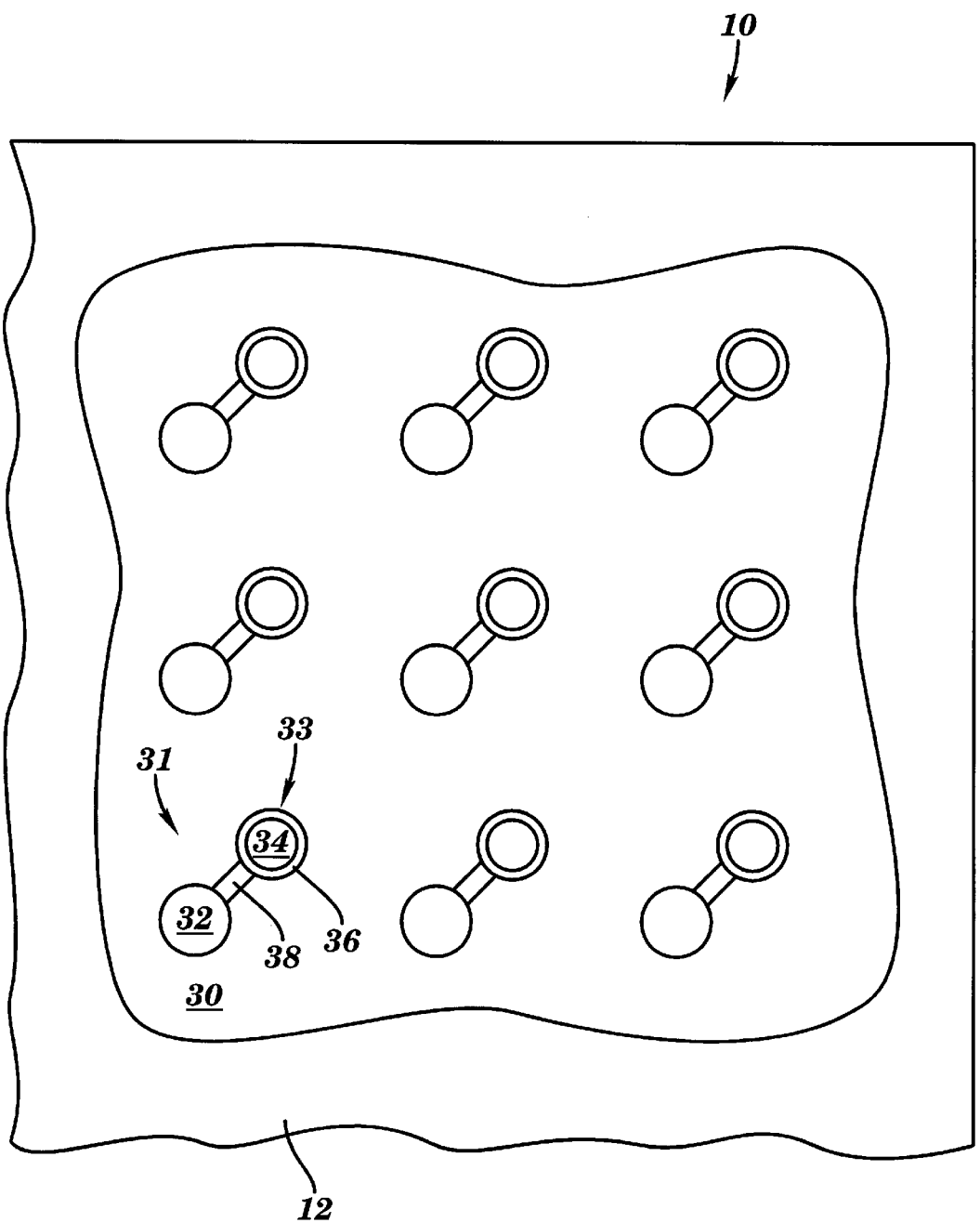
FIG. 2 depicts a top view of the top surface of FIG. 1, illustrating a ball grid array landing area with a dog bone pattern.
Figure 3:
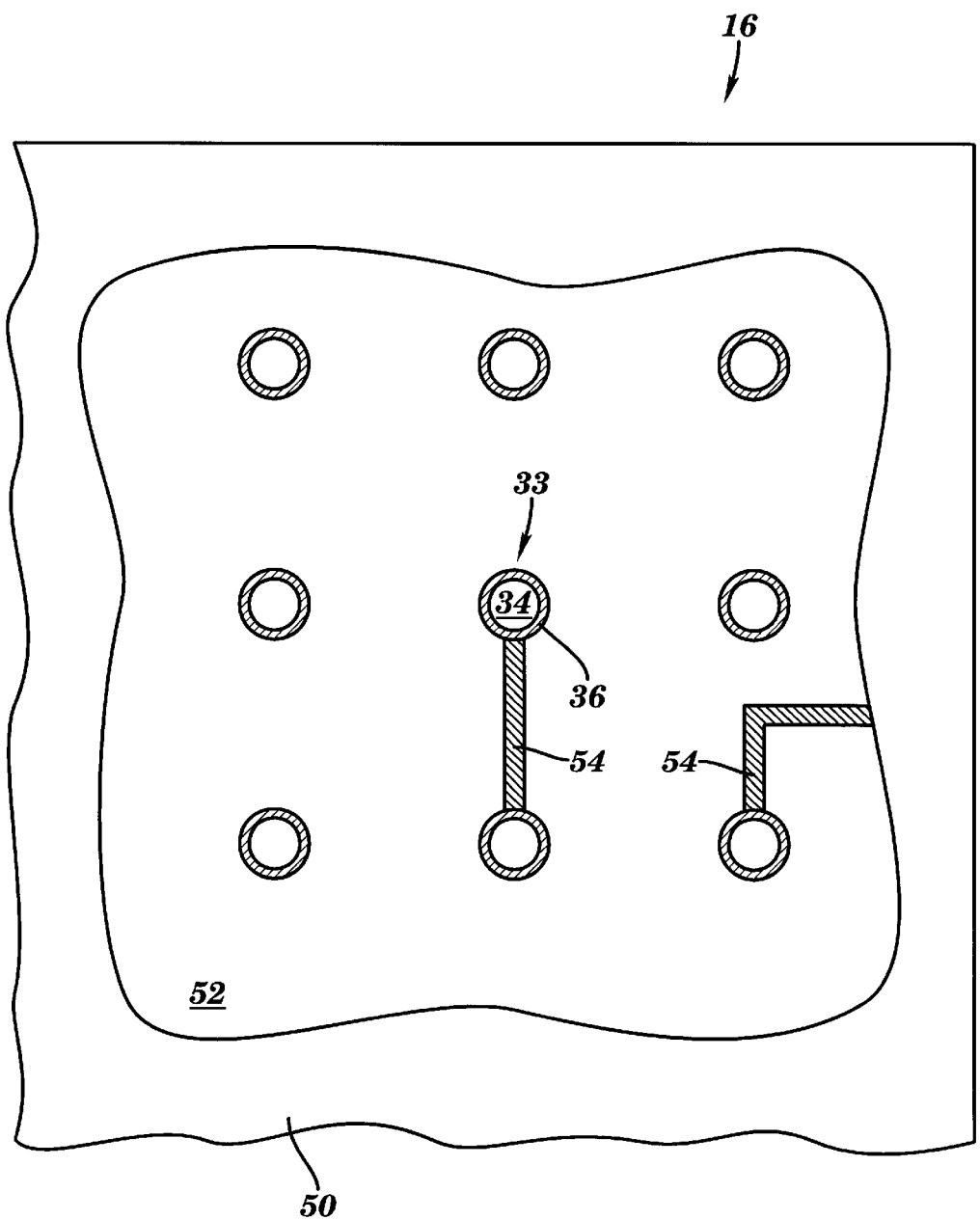
FIG. 3 depicts a cross-sectional view of the middle layer of FIG. 1, illustrating a via coupled to a conductive circuit trace.
Figure 4:
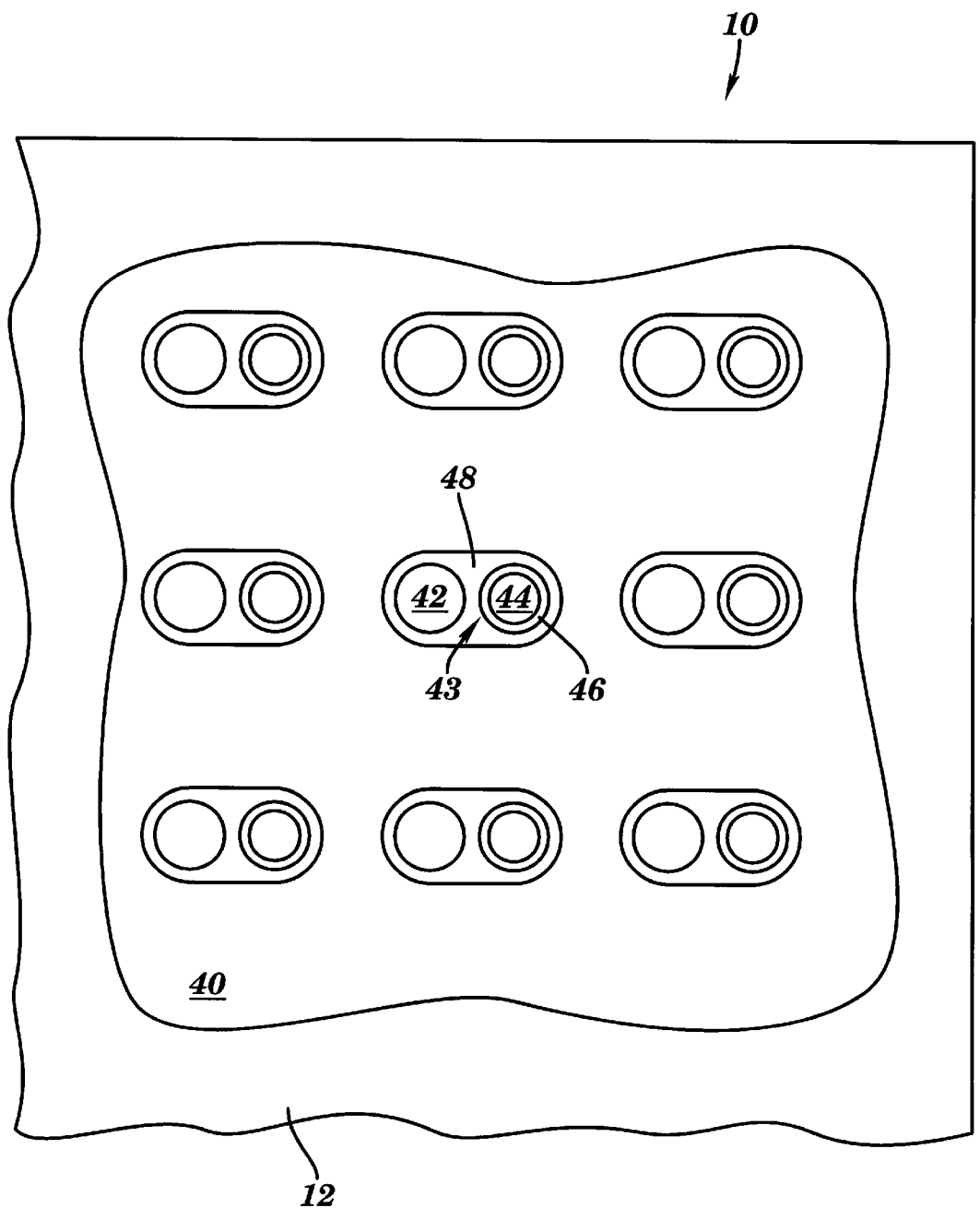
FIG. 4 depicts a top view of the top surface of FIG. 1, illustrating a ball grid array landing area with a connecting plate pattern.
Figure 5:
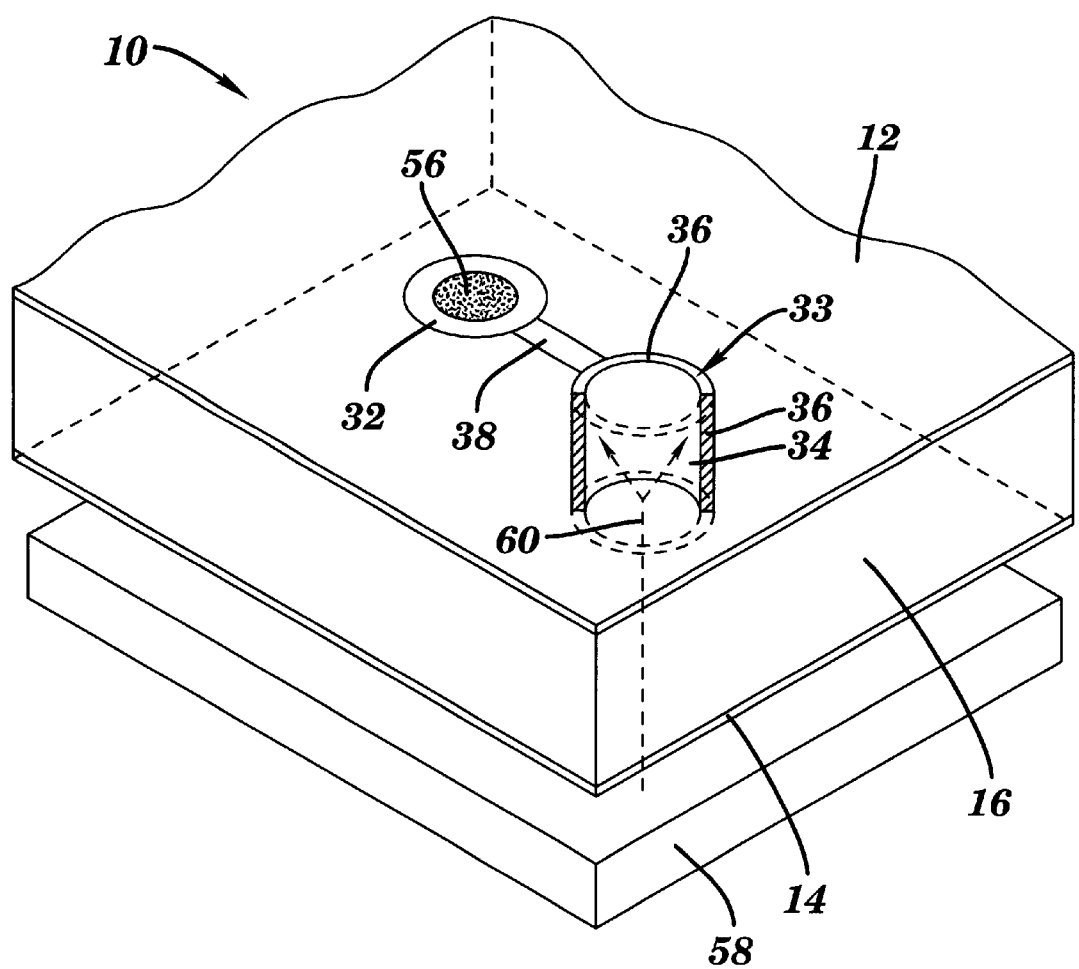
FIG. 5 depicts a top perspective view of the via in FIG. 2, illustrating the electrical connections and further illustrating the flow of hot molten solder into a via through the bottom face, wherein the via is shown in its entirety in a partially cut-away configuration.
Figure 6:
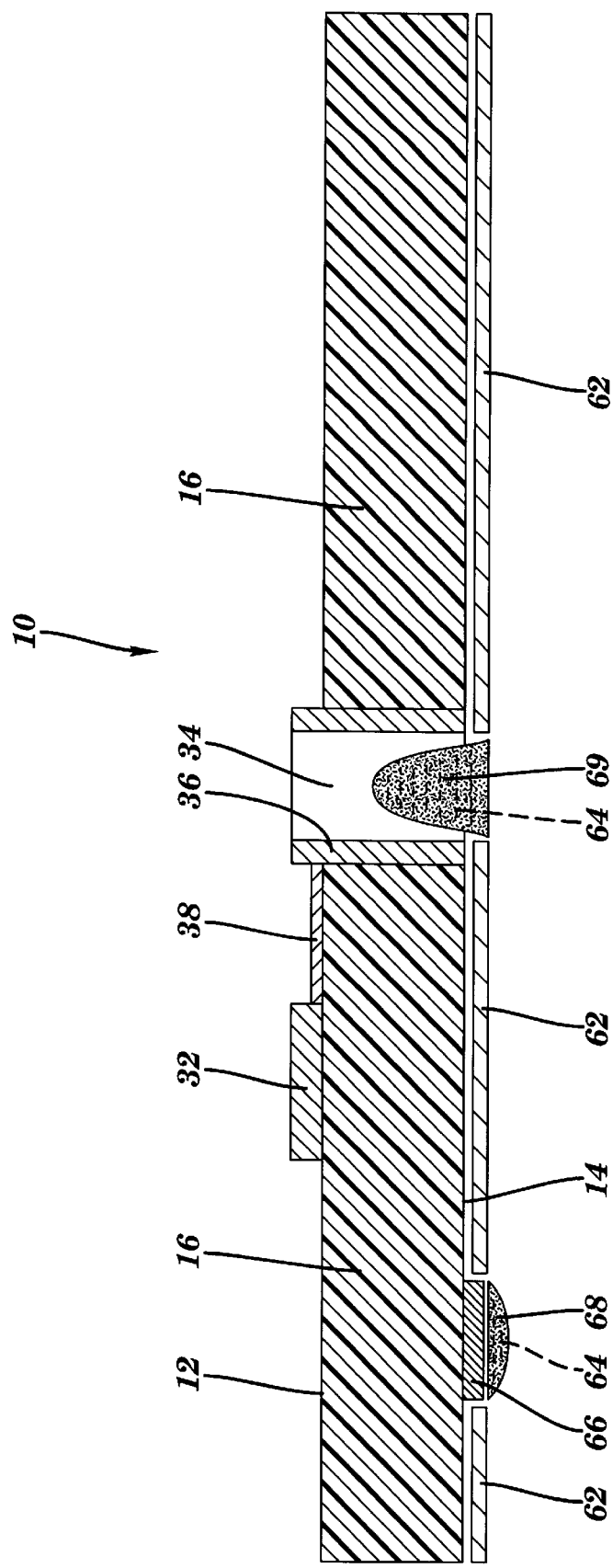
FIG. 6 depicts a cross-sectional view of the printed circuit board, illustrating the screening of solder paste onto a bottom pad and into a via in accordance with the preferred embodiment of the present invention.
Figure 8:
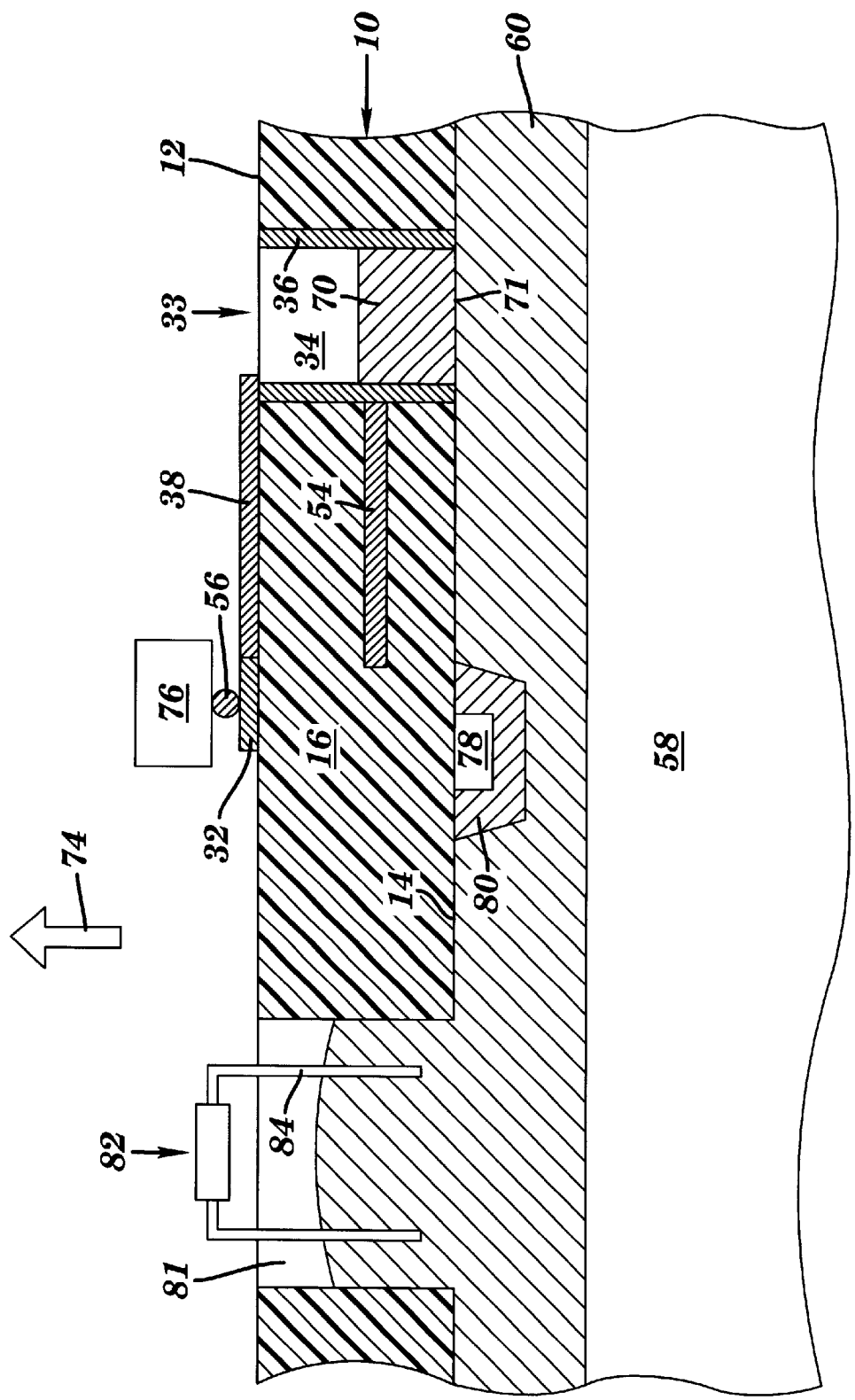
FIG. 8 depicts a front cross-sectional view of the printed circuit board of FIG. 7 being wave soldered with molten solder in contact with the bottom surface of the printed circuit board.

FIG. 8 illustrates a front cross-sectional view of the printed circuit board 10 of FIG. 7 being wave soldered with the molten solder 60 (see FIG. 5; page 7, lines 12–15) in contact with the bottom surface 14 of the printed circuit board 10 and also in contact with an end 71 of the conductive plug 70. The molten solder 60 is moving in a direction 74 from the wave soldering source 58 (see FIG. 5) toward the bottom surface 14. The plug 70 obstructs a flow of the molten solder 60 into the via 33. Accordingly, the plug 70 inhibits heat transfer from the molten solder 60 to the conductive lining 36, and thus to the top pad 32. Consequently, heat from the molten solder 60 cannot cause degradation at the solder ball 56 interface between the top pad 32 and a component 76 (e.g., a BGA). Note that a component 78 at the bottom surface 14 is shielded from the molten solder 60 by a mask 80. Conductive leads 84 of a pin-in-hole component 82 in a via 81 is contacted by the molten solder 60. The via 33 is in electrically conductive contact with the electrical circuit trace 54 (see FIG. 3) within the middle layer 16.

Figure 9:
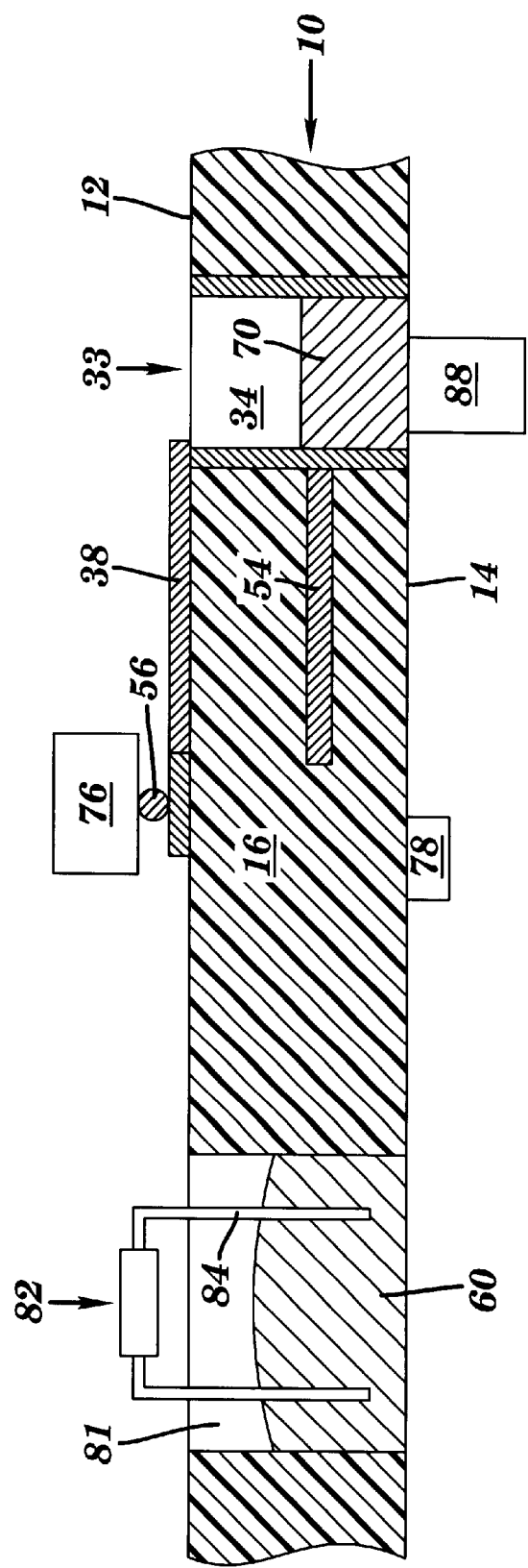
FIG. 9 depicts the printed circuit board of FIG. 8, following the wave soldering, with an added instrumental probe.

FIG. 9 illustrates the printed circuit board 10 of FIG. 8 following the wave soldering. An instrumental probe 88 is in electrically conductive contact with the plug 70. The instrumental probe 88 is used for testing the printed circuit board 10. Note that the solder 60 in FIG. 9 is not molten as it was in FIG. 8, because the configuration of FIG. 9 exists after the wave soldering and not during the wave soldering.

Although the preferred embodiment of the present invention utilizes a screening and reflow process for generating a plug 70 in the via void 34, any method for generating a volumetric plug within the via void 34, that would effectively prevent heat transfer from molten solder to a top pad 32, is within the scope of the present invention. Likewise, the plug material need not be solder and the plug may comprise any material capable of thermally insulating the via from the molten solder.

The present invention encompasses any embodiment that creates a plug in a via void even in the absence of a wave soldering step, since the plug may be useful for purposes other than inhibiting heat transfer. By its contact with the exposed surface of the via lining, for example, the plug may beneficially retard oxidation of the via lining. Additionally, an electrically conductive plug may facilitate the testing of a circuit board assembly by serving as an electrical contact surface for an instrumental probe.

Thermal degradation of a solder joint at the interface between a component and a pad is a potential problem whenever a top pad is electrically and thermally coupled to a via. Accordingly, the potential problem is not specific to a BGA configuration. Thus, while the preferred embodiment involves a via associated with a BGA configuration, the present invention encompasses any surface mount component affixed to a pad that is electrically coupled to a via, including a component having a lead.

Although the preceding description of the preferred embodiment depicts a printed circuit board as having a top and a bottom surface, any orientation of the circuit board with respect to the horizontal plane is within the scope of the present invention.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A printed circuit board assembly, comprising:
    a printed circuit board having a top surface, a bottom surface, and a middle layer between the top surface and the bottom surface;
    a conductive pad on the top surface;
    a via extending through the printed circuit board from the top surface to the bottom surface, wherein a conductive lining on an interior wall of the via is conductively coupled to the pad;
    a plug within the via, wherein the plug comprises a nonsolder material; and
    molten solder in contact with an end of the plug, wherein the end of the plug is at the bottom surface, and wherein the plug obstructs flow of the molten solder into the via.

2. The printed circuit board assembly of claim 1, wherein the plug inhibits heat transfer from the molten solder to the conductive lining.

3. The printed circuit board assembly of claim 1, wherein the plug inhibits heat transfer from the molten solder to the conductive pad.

4. The printed circuit board assembly of claim 1, wherein the plug comprises a solder material.

5. The printed circuit board assembly of claim 1, further comprising a component coupled to the conductive pad by a solder joint, wherein heat from the molten solder does not cause degradation of the solder joint.

6. The printed circuit board assembly of claim 5, wherein the component includes a BGA component.

7. A method for constructing a printed circuit board assembly, comprising the steps of:
    (a) providing a printed circuit board comprising:
        a top surface comprising a top pad, wherein the top pad is electrically connectable to a top component;
        a bottom surface; and
        a via extending through the circuit board from the top surface to the bottom surface, wherein the via is electrically connected to the top pad, and wherein the via includes an opening at the bottom surface;
    (b) forming a conductive lining on an interior wall of the via such that the conductive lining is conductively coupled to the top pad;
    (c) forming a plug in the via by inserting a volume of material into the via through the opening in the via, wherein the volume of material comprises a nonsolder material; and
    (d) contacting an end of the plug with molten solder, wherein the end of the plug is at the bottom surface, and wherein the plug obstructs flow of the molten solder into the via.

8. The method of claim 7, wherein the printed circuit board comprises a middle layer between the top surface and the bottom surface, wherein the middle layer comprises an electrical circuit pattern, and wherein the via is electrically connected to the electrical circuit pattern.

9. The method of claim 7, further comprising the steps of:
    installing the top component on the top surface, wherein a contact element of the top component is mechanically and electrically affixed to the top pad;
    placing a second component on the printed circuit board; and
    wave soldering the bottom surface, wherein the second component is mechanically and electrically affixed to the printed circuit board.

10. The method of claim 7, wherein step (b) is preceded by the step of:

installing the top component on the top surface, wherein a contact element of the top component is mechanically and electrically affixed to the top pad; and wherein step (b) is followed by the steps of:

placing a second component on the printed circuit board; and wave soldering the bottom surface, wherein the second component is mechanically and electrically affixed to the printed circuit board.

11. The method of claim 9, wherein the top component is a ball grid array module, and wherein the contact element is a solder ball.

12. The method of claim 9, wherein the top component is a surface mount device with a lead, wherein the contact element is the lead.

13. The method of claim 9, wherein the installation of the top component is accomplished by a process comprising the steps of:

screening solder paste onto the top pad to form a layer of solder;

placing the top component on the top surface, wherein the contact element is in mechanical and electrical contact with the top pad; and reflowing the layer of solder, wherein the contact element is mechanically and electrically affixed to the top pad.

14. The method of claim 9, wherein the second component is a pin-in-hole component comprising a pin-component lead, wherein the pin-in-hole component is placed on the top surface, wherein the pin-component lead is directed from the top surface into a pin hole, and wherein the pin hole extends from the top surface to the bottom surface.

15. The method of claim 9, wherein the second component is a bottomside component, wherein the bottomside component is mounted on the bottom surface, and wherein the bottomside component is in mechanical and electrical contact with the bottom surface.

\* \* \* \* \*